United States Patent
Lin et al.

[11] Patent Number: 6,140,231
[45] Date of Patent: Oct. 31, 2000

[54] ROBUST DIFFUSION BARRIER FOR CU METALLIZATION

[75] Inventors: Chung-Shi Lin; Shau-Lin Shu; Chen-Hua Yu, all of Hsin-Chu, Taiwan

[73] Assignee: Taiwan Semiconductor Manufacturing Company, Hsin-Chu, Taiwan

[21] Appl. No.: 09/249,257

[22] Filed: Feb. 12, 1999

[51] Int. Cl.[7] .................................................. H01L 21/44
[52] U.S. Cl. ............................................................ 438/653
[58] Field of Search ...................................... 438/627, 628, 438/687, 643, 653, 651, 655, 657, 672, 675, 644; 451/57

[56] References Cited

U.S. PATENT DOCUMENTS

| | | | |
|---|---|---|---|
| 5,420,063 | 5/1995 | Maghsoudnia et al. | 437/60 |
| 5,661,503 | 8/1997 | Terai | 347/63 |
| 5,676,587 | 10/1997 | Landers et al. | 451/57 |
| 5,683,928 | 11/1997 | Wojnarowski et al. | 438/628 |
| 5,714,418 | 2/1998 | Bai et al. | 438/627 |
| 5,893,752 | 4/1999 | Zhang et al. | 438/687 |
| 6,001,730 | 12/1999 | Farkas et al. | 438/627 |

*Primary Examiner*—David Nelms
*Assistant Examiner*—Dung A Le
*Attorney, Agent, or Firm*—George O. Saile; Stephen B. Ackerman; Rosemary L.S. Pike

[57] ABSTRACT

A new method of forming a stacked tantalum nitride barrier layer to prevent copper diffusion is described. Semiconductor device structures are provided in and on a semiconductor substrate. The semiconductor device structures are covered with an insulating layer. A via is opened through the insulating layer to one of the underlying semiconductor device structures. A stacked mode tantalum nitride barrier layer is conformally deposited within the via. A layer of copper is deposited overlying the stacked mode tantalum nitride barrier layer to complete copper metallization in the fabrication of an integrated circuit device. The stacked mode tantalum nitride barrier layer has misaligned grain boundaries. This prevents diffusion of copper into the dielectric layer.

16 Claims, 3 Drawing Sheets

ROBUST DIFFUSION BARRIER FOR CU METALLIZATION

BACKGROUND OF THE INVENTION (1) Field of the Invention

The invention relates to a method of barrier layer formation in the fabrication of integrated circuits, and more particularly, to a method of forming a stacked mode tantalum nitride barrier layer to prevent copper diffusion in the manufacture of integrated circuits.

(2) Description of the Prior Art

In a common application for integrated circuit fabrication, a contact/via opening is etched through an insulating layer to an underlying conductive area to which electrical contact is to be made. A barrier layer, typically titanium nitride, is formed within the contact/via opening. A conducting layer material, typically tungsten, is deposited within the contact/via opening. As device sizes continue to shrink, these typical materials are no longer adequate. Because of its lower bulk resistivity, Copper (Cu) metallization is the future technology for feature sizes of 0.18 microns and below. Cu has been used successfully as an interconnection line, but tungsten is still used at the contact level to avoid damage to devices. Cu metallization requires a robust diffusion barrier to prevent the copper from diffusing through the active junctions.

Co-pending U.S. patent application Ser. No. 08/985/404 to S.C. Sun et al, filed on Dec. 5, 1997 discloses a molybdenum nitride barrier for copper metallization. Co-pending U.S. patent applications Ser. No. 09/083,419 to J. B. Lai et al, filed on May 22, 1998 and Ser. No. 09/072/004 to C. S. Lin filed on May 4, 1998 teach a $Cu_3Ge$ barrier layer for copper metallization. U.S. Pat. No. 5,661,503 to Terai discloses a heat-generating resistor layer of $Ta_2N$ under a wiring layer such as Al in the fabrication of a liquid jet recording head. U.S. Pat. No. 5,683,928 to Wojnarowski et al and U.S. Pat. No. 5,420,063 to Maghsoudnia et al teach fabricating a thin film resistor using a resistor layer of TaN or $Ta_2N$. U.S. Pat. No. 5,676,587 to Landers et al teaches a CMP method for a Ta/TaN/Cu stack. U.S. Pat. No. 5,714,418 to Bai et al teaches a blocking layer, such as TaN or Ta, under a copper layer and a capturing layer, such as Ti, under the blocking layer.

SUMMARY OF THE INVENTION

A principal object of the present invention is to provide an effective and very manufacturable method of forming a robust barrier layer in a copper metallization process in the fabrication of integrated circuit devices.

Another object of the invention is to provide a method for forming a stacked tantalum nitride barrier layer that will prevent copper from diffusing into active junctions.

A further object of the invention is to increase the length of the diffusion path to prevent copper diffusion into the underlying dielectric layer in the fabrication of integrated circuits.

Yet another object of the invention is to provide a method for forming a stacked tantalum nitride barrier layer to increase the length of the diffusion path to prevent copper diffusion into the underlying dielectric layer in the fabrication of integrated circuits.

Yet another object of the invention is to provide a method for forming a stacked tantalum nitride barrier layer which can be used to prevent copper diffusion at the contact or via levels.

In accordance with the objects of this invention a new method of forming a stacked tantalum nitride barrier layer to prevent copper diffusion is achieved. Semiconductor device structures are provided in and on a semiconductor substrate. The semiconductor device structures are covered with an insulating layer. A via is opened through the insulating layer to one of the underlying semiconductor device structures. A stacked mode tantalum nitride barrier layer is conformally deposited within the via. A layer of copper is deposited overlying the stacked mode tantalum nitride barrier layer to complete copper metallization in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
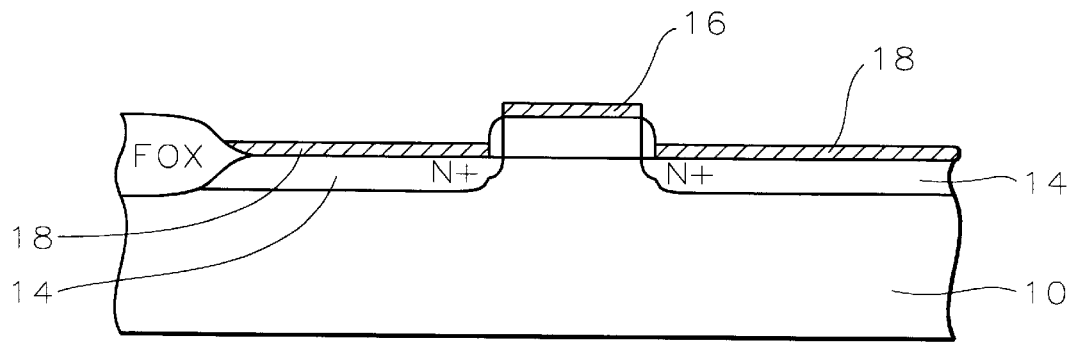
FIGS. 1 through 6 schematically illustrate in cross-sectional representation a preferred embodiment of the present invention.

Referring now more particularly to FIG. 1, there is illustrated a portion of a partially completed integrated circuit device. There is shown a semiconductor substrate 10, preferably composed of monocrystalline silicon. Semiconductor devices structures are formed in and on the semiconductor substrate. For example, a gate electrode 16 and a source/drain region 14 are illustrated in FIG. 1. Source/drain region 14 is an N+ region in the illustration. It is well understand by those skilled in the art that this could be a P+ region as well. It should be understood that the invention is not limited to the embodiment illustrated in the drawing figures, but is applicable to any application in which copper metallization is used.

A silicide layer 18 may be formed on the gate electrode 16 and overlying the source/drain regions 14. This layer may be titanium silicide or cobalt silicide, or the like, and is formed by conventional methods.

Figure 2:
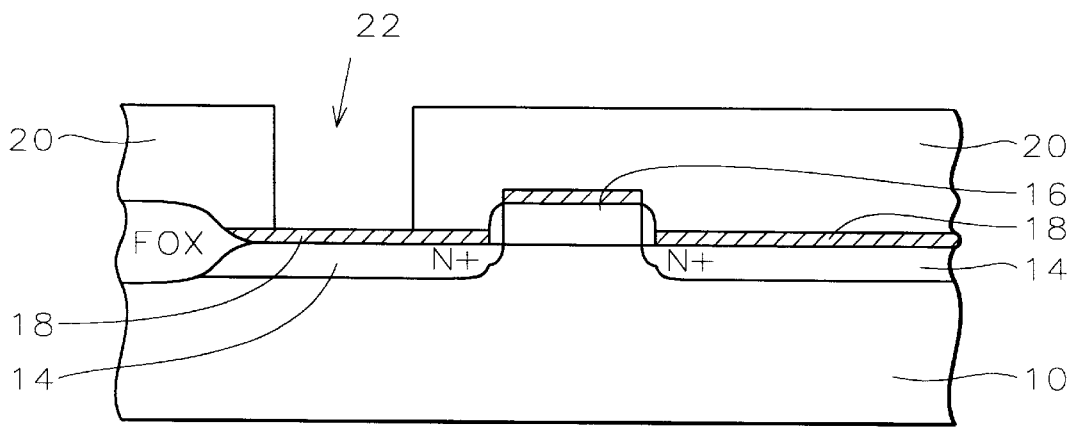

As shown in FIG. 2, an insulating layer 20, composed of silicon dioxide, borophosphosilicate glass (BPSG), borosilicate glass (BSG), phosphosilicate glass (PSG), or the like, is deposited over the surface of the silicided semiconductor structures to a thickness of between about 5000 to 9000 Angstroms and preferably planarized. A contact/via opening or a dual damascene opening 22 is etched through the insulating layer 20 to the silicide layer 18 overlying the source/drain region 14 within the semiconductor substrate. The silicide 18 is not a good diffusion barrier to copper.

Figure 3:
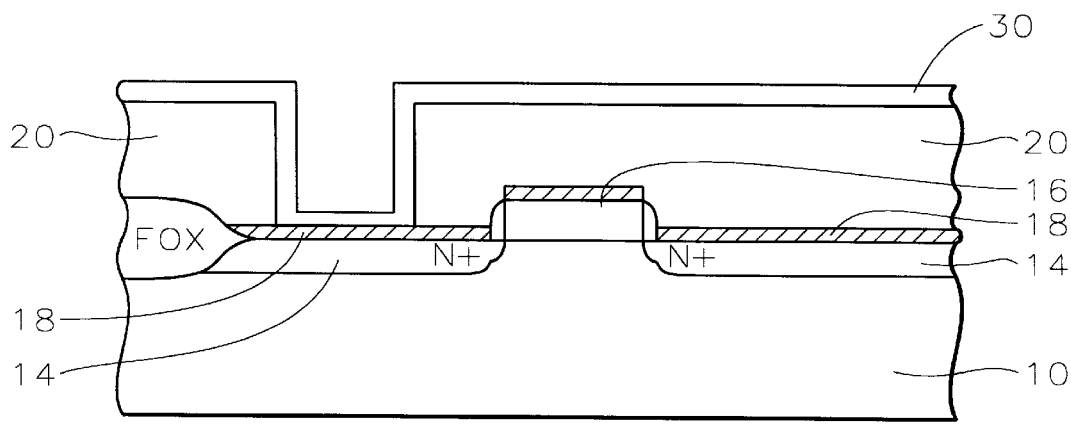

Optionally, a layer of tantalum (Ta) 30 may be sputter deposited within the contact/via opening 22, as illustrated in FIG. 3. The Ta layer can improve adhesion of the subsequently deposited layer. The Ta layer is deposited to a thickness of between about 50 and 300 Angstroms.

The stacked TaN barrier layer of the present invention will now be described. The optional Ta layer illustrated in FIG. 3 will not be illustrated in the subsequent figures. If the optional Ta layer is used, the stacked TaN barrier layer is formed over the Ta layer.

TaN is a better barrier material than is Ta. The stacked mode barrier of the present invention increases the length of the diffusion path to prevent copper atoms from diffusing through the barrier layer to the underlying dielectric layer 20. The stacked mode barrier comprises two layers of tantalum nitride. The layers are $Ta_2N/TaN$ or $TaN/Ta_2N$. The layers are formed by a reactive ion sputtering process with a tantalum target including Argon and $N_2$ flow. A larger $N_2$ flow, for example, between about 15 and 20 sccm, results in TaN while a smaller $N_2$ flow, for example, between about 10 and 15 sccm, results in $Ta_2N$.

Figure 4:
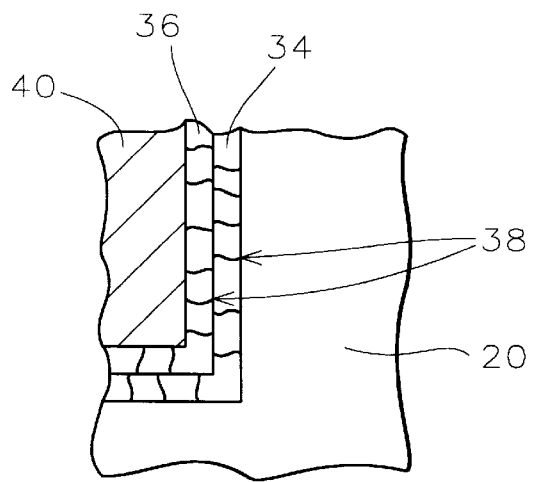

The TaN layer has a face-centered cubic (fcc) structure while the $Ta_2N$ layer has either a hexagonal close packed (hcp) structure or an amorphous form. Because the two layers are of different structure, their grain boundaries will be misaligned. FIG. 4 illustrates an enlarged view of the grain boundaries 38 of the two layers 34 and 36.

Figure 5:
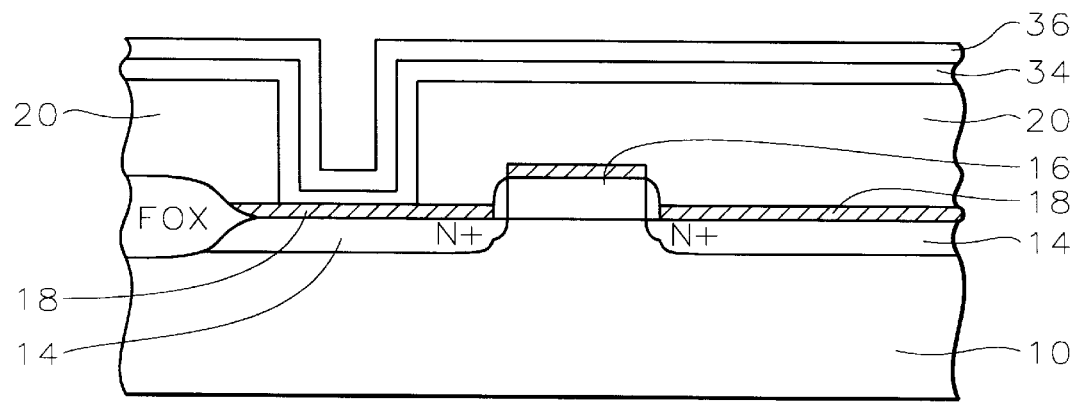

Referring now to FIG. 5, there is shown the stacked mode tantalum nitride barrier layer comprising layers 34 and 36. The layers 34 and 36 are TaN and $Ta_2N$, respectively, or $Ta_2N$ and TaN, respectively. The thickness of each layer is between about 100 and 300 Angstroms.

Figure 6:
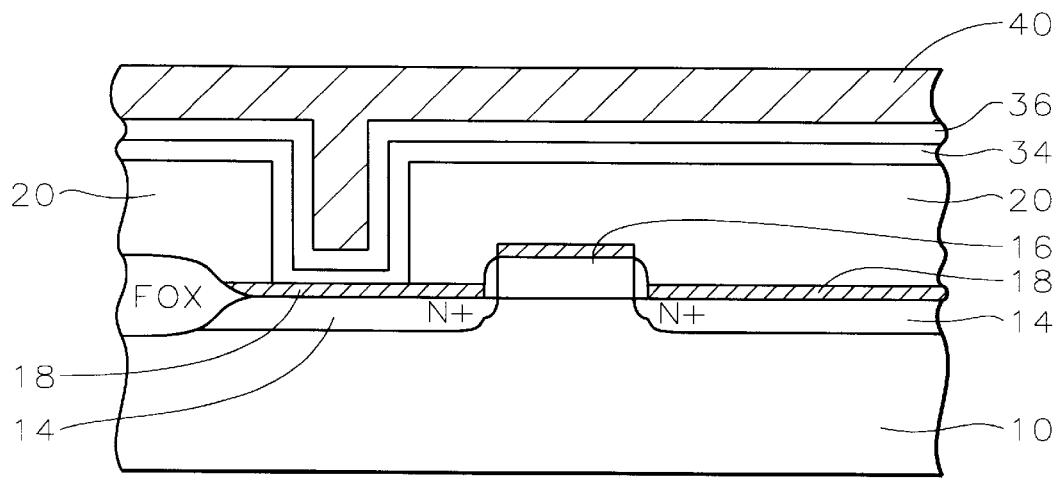

Referring now to FIG. 6, a layer of copper 40 is sputter deposited over the barrier layer to fill the contact/via opening. Or, a copper seed layer is deposited by physical or chemical vapor deposition followed by electrochemical deposition of copper to fill a deep via hole. Copper diffusion into the dielectric layer 20 is prevented by the longer diffusion path due to the misaligned grain boundaries of the stacked mode diffusion barrier layer 34/36.

Figure 7:
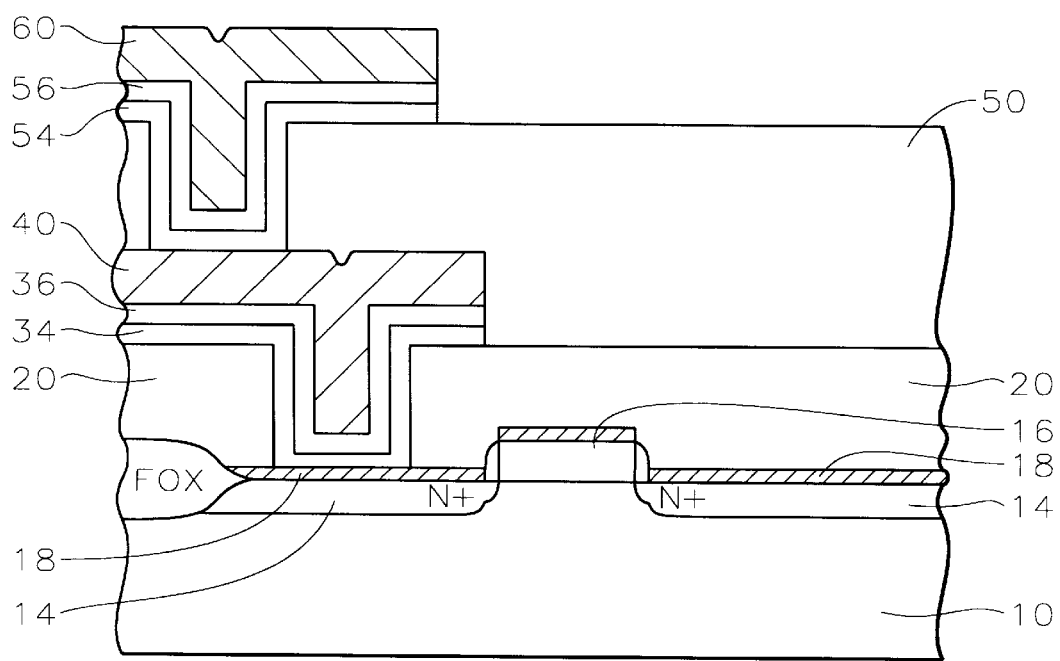
FIG. 7 schematically illustrates in cross-sectional representation a preferred embodiment of the present invention for higher level metallization.

The copper layer and the barrier layer are patterned to form the desired electrical contact. Processing continues as is conventional in the art to complete fabrication of the integrated circuit. The process of the present invention can be used at the contact or via levels. The figures have illustrated copper metallization at the contact level. FIG. 7 illustrates a copper metallization at the via level.

For example, after patterning of the copper contact 40, an intermetal dielectric layer 50 is deposited over the surface of the substrate. A via opening is etched through the dielectric layer 50 to contact the metal layer 40. The stacked mode diffusion barrier layer of the present invention is formed within the via opening. Layers 54 and 56 comprise $TaN/Ta_2N$ or $Ta_2N/TaN$. A second layer of copper is deposited into the via opening and the copper and barrier metal layers are patterned to form second level metallization 60, as shown.

The process of the invention results in an effective and very manufacturable stacked mode tantalum nitride diffusion barrier for copper metallization. The stacked mode barrier layer lengthens the diffusion path because of misaligned grain boundaries thereby preventing diffusion of the copper atoms into the dielectric layer.

While the invention has been particularly shown and described with reference to the preferred embodiments thereof, it will be understood by those skilled in the art that various changes in form and details may be made without departing from the spirit and scope of the invention.

What is claimed is:

1. A method of copper metallization in the fabrication of an integrated circuit device comprising:

providing semiconductor device structures in and on a semiconductor substrate wherein said semiconductor device structures include silicided gate electrodes and associated silicided source and drain regions and lower level metallization;

covering said semiconductor device structures with an insulating layer;

opening a via through said insulating layer to one of said underlying semiconductor device structures;

conformally depositing a stacked mode tantalum nitride barrier layer within said via wherein said stacked mode tantalum nitride barrier layer comprises a first layer of TaN and a second layer of $Ta_2N$ and wherein grain boundaries of said TaN layer and said $Ta_2N$ layer are misaligned; and depositing a layer of copper overlying said stacked mode tantalum nitride barrier layer to complete said copper metallization in the fabrication of said integrated circuit device.

2. The method according to claim 1 further comprising depositing a tantalum layer underlying said stacked mode tantalum nitride barrier layer.

3. The method according to claim 1 wherein said step of depositing said stacked mode tantalum nitride barrier layer comprises:

depositing a first layer of TaN within said via opening; and depositing a second layer of $Ta_2N$ overlying said TaN layer.

4. The method according to claim 1 wherein said step of depositing said stacked mode tantalum nitride barrier layer comprises:

depositing a first layer of $Ta_2N$ within said via opening; and depositing a second layer of TaN overlying said $Ta_2N$ layer.

5. The method according to claim 1 wherein said TaN layer has a face-centered cubic structure and wherein said $Ta_2N$ layer has a hexagonal closed package structure.

6. The method according to claim 1 wherein said TaN layer has a face-centered cubic structure and wherein said $Ta_2N$ layer has an amorphous structure.

7. The method according to claim 1 wherein said stacked mode tantalum nitride barrier layer prevents copper diffusion into said insulating layer.

8. A method of copper metallization in the fabrication of an integrated circuit device comprising:

providing semiconductor device structures in and on a semiconductor substrate wherein said semiconductor device structures include silicided gate electrodes and associated silicided source and drain regions and lower level metallization;

covering said semiconductor device structures with an insulating layer;

opening a via through said insulating layer to one of said underlying semiconductor device structures;

conformally depositing a stacked mode tantalum nitride barrier layer within said via wherein said stacked mode tantalum nitride barrier layer comprises a first layer of TaN and a second layer of $Ta_2N$ wherein said TaN layer has a face-centered cubic structure and wherein said $Ta_2N$ layer has a hexagonal closed package structure and wherein grain boundaries of said TaN layer and said $Ta_2N$ layer are misaligned; and depositing a layer of copper overlying said stacked mode tantalum nitride barrier layer to complete said copper metallization in the fabrication of said integrated circuit device.

9. The method according to claim 8 further comprising depositing a tantalum layer underlying said stacked mode tantalum nitride barrier layer.

10. The method according to claim 8 wherein said step of depositing said stacked mode tantalum nitride barrier layer comprises: depositing a first layer of TaN within said via opening; and depositing a second layer of Ta$_2$N overlying said TaN layer.

11. The method according to claim 8 wherein said step of depositing said stacked mode tantalum nitride barrier layer comprises:

depositing a first layer of Ta$_2$N within said via opening; and depositing a second layer of TaN overlying said Ta$_2$N layer.

12. The method according to claim 8 wherein said stacked mode tantalum nitride barrier layer prevents copper diffusion into said insulating layer.

13. A method of copper metallization in the fabrication of an integrated circuit device comprising:

providing semiconductor device structures in and on a semiconductor substrate wherein said semiconductor device structures include silicided gate electrodes and associated silicided source and drain regions and lower level metallization;

covering said semiconductor device structures with an insulating layer;

opening a via through said insulating layer to one of said underlying semiconductor device structures;

depositing a tantalum layer within said via;

conformally depositing a stacked mode tantalum nitride barrier layer within said via overlying said tantalum layer wherein said stacked mode tantalum nitride barrier layer comprises a layer of TaN overlying a layer of Ta$_2$N wherein said TaN layer has a face-centered cubic structure and wherein said Ta$_2$N layer has an amorphous structure and wherein the grain boundaries of said TaN and said Ta$_2$N layers are misaligned; and depositing a layer of copper overlying said stacked mode tantalum nitride barrier layer wherein said misaligned grain boundaries prevents said copper from diffusing through said stacked mode tantalum nitride barrier layer into said insulating layer to complete said copper metallization in the fabrication of said integrated circuit device.

14. The method according to claim 1 wherein said TaN layer is formed by reactive ion sputtering using a tantalum target and N$_2$ gas flowed at between about 15 and 20 sccm and wherein said Ta$_2$N layer is formed by reactive ion sputtering using a tantalum target and N$_2$ gas flowed at between about 10 and 25 sccm.

15. The method according to claim 8 wherein said TaN layer is formed by reactive ion sputtering using a tantalum target and N$_2$ gas flowed at between about 15 and 20 sccm and wherein said Ta$_2$N layer is formed by reactive ion sputtering using a tantalum target and N$_2$ gas flowed at between about 10 and 25 sccm.

16. The method according to claim 13 wherein said TaN layer is formed by reactive ion sputtering using a tantalum target and N$_2$ gas flowed at between about 15 and 20 sccm and wherein said Ta$_2$N layer is formed by reactive ion sputtering using a tantalum target and N$_2$ gas flowed at between about 10 and 25 sccm.

* * * * *